(12) United States Patent
Hou et al.

(10) Patent No.: US 8,930,865 B1
(45) Date of Patent: Jan. 6, 2015

(54) LAYOUT CORRECTING METHOD AND LAYOUT CORRECTING SYSTEM

(71) Applicant: United Microelectronics Corp., Hsinchu (TW)

(72) Inventors: Hsin-Ming Hou, Tainan (TW); Ji-Fu Kung, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/150,046

(22) Filed: Jan. 8, 2014

(51) Int. Cl.
 *G06F 17/50* (2006.01)
(52) U.S. Cl.
 CPC .................................. *G06F 17/5081* (2013.01)
 USPC .................. 716/112; 716/51; 716/52; 716/53
(58) Field of Classification Search
 CPC ............ G06F 17/5068; G06F 17/5081; G06F 17/5036; G06F 17/5022; G06F 17/5072; G03F 1/144; G03F 1/36; G03F 7/705
 USPC ......................... 716/51, 52, 53, 112
 See application file for complete search history.

(56) References Cited

U.S. PATENT DOCUMENTS

| | | | |
|---|---|---|---|
| 7,707,528 B1 | 4/2010 | White et al. | |
| 8,037,433 B2 | 10/2011 | Chidambarrao et al. | |
| 8,418,087 B2 | 4/2013 | Banerjee et al. | |
| 8,434,030 B1 | 4/2013 | Hou et al. | |
| 2006/0136861 A1* | 6/2006 | Lucas et al. | 716/21 |
| 2006/0150132 A1* | 7/2006 | Gupta | 716/5 |

FOREIGN PATENT DOCUMENTS

| | | | | |
|---|---|---|---|---|
| JP | 2003132110 A | * | 5/2003 | ............. G06F 17/50 |
| TW | 201314227 A | | 4/2013 | |
| TW | 201329762 A | | 7/2013 | |

\* cited by examiner

*Primary Examiner* — Vuthe Siek
(74) *Attorney, Agent, or Firm* — WPAT, PC; Justin King

(57) ABSTRACT

A layout correcting method and a layout correcting system are provided. The layout correcting method includes the following steps. An integrated circuit design layout is provided. A plurality of performance parameters of the integrated circuit design layout are analyzed. A plurality of devices under test is selected according to the performance parameters. A computer simulating process is performed on the devices under test and a direct probing process is performed on the devices under test. The direct probing process is an on-chip test for comparing each device under test and an environment condition thereof by a Boolean algebra algorithm. A plurality of differences between the results of the computer simulating process and the direct probing process is analyzed. The integrated circuit design layout is corrected according to differences between the results of the computer simulating process and the direct probing process.

18 Claims, 4 Drawing Sheets

LAYOUT CORRECTING METHOD AND LAYOUT CORRECTING SYSTEM

BACKGROUND

1. Technical Field

The disclosure relates in general to a correcting method and a correcting system, and more particularly to a layout correcting method and a layout correcting system.

2. Description of the Related Art

As known, it takes multiple stages to fabricate an integrated circuit product from the beginning of designing the integrated circuit. Generally, some defects are possibly generated in any of the multiple stages. If the defect is found after the integrated circuit product is fabricated, it is necessary to identify the source of problems from the beginning. Under this circumstance, the speed of launching the product will be slowed down.

For solving these drawbacks, a simple rule (e.g. a minimum critical dimension) or a physical model is conventionally used in the circuit design layout in order to sieve out the area that is unable to tolerate the process variation. In such way, the hotspots prone to error in mass production can be identified in the earlier stages. After the hotspots are identified, the technician may try to improve the production process and eliminate the possible product weakness in the earlier stages. However, since the conventional method lacks systematical and hierarchical analyses, the estimated hotspots are far from the real electrical performance of the product. Under this circumstance, the product yield is usually unsatisfied.

Moreover, analyzing layout dependent effect (LDE) on circuit performance is a big challenge. It is hard to consider process and circuit layout interaction once the machine/processing conditions are changed. Therefore, there is a need for providing a layout correcting method considering the surrounding environments.

SUMMARY

The disclosure is directed to a layout correcting method and a layout correcting system, a direct probing process is performed on the devices under test for considering the surrounding environments and a smarting sizing is performed for accurately correcting the integrated circuit design layout.

According to a first aspect of the present disclosure, a layout correcting method is provided. The layout correcting method includes the following steps. An integrated circuit design layout is provided. A plurality of performance parameters of the integrated circuit design layout are analyzed. A plurality of devices under test is selected according to the performance parameters. A computer simulating process is performed on the devices under test and a direct probing process is performed on the devices under test. The direct probing process is an on-chip test for comparing each device under test and an environment condition thereof by a Boolean algebra algorithm. A plurality of differences between the results of the computer simulating process and the direct probing process is analyzed. The integrated circuit design layout is corrected according to differences between the results of the computer simulating process and the direct probing process.

According to a second aspect of the present disclosure, a layout correcting system is provided. The layout correcting system includes a providing unit, an analyzing unit, a selecting unit, a simulating unit, a directing probing unit, a comparing unit and a correcting unit. The providing unit is for providing an integrated circuit design layout. The analyzing unit is for analyzing a plurality of performance parameters of the integrated circuit design layout. The selecting unit is for selecting a plurality of devices under test according to the performance parameters. The simulating unit is for performing a computer simulating process on the devices under test. The directing probing unit is for performing a direct probing process on the devices under test. The direct probing process is an on-chip test for comparing each device under test and an environment condition thereof by a Boolean algebra algorithm. The comparing unit is for analyzing a plurality of differences between the results of the computer simulating process and the direct probing process. The correcting unit is for correcting the integrated circuit design layout according to differences between the results of the computer simulating process and the direct probing process.

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. A direct probing process is performed on the devices under test for considering the surrounding environments and a smarting sizing is performed for accurately correcting the integrated circuit design layout. The following embodiments are for the purpose of elaboration only, not for limiting the scope of protection of the invention. Besides, secondary elements are omitted in the following embodiments to highlight the technical features of the invention.

Figure 1A:
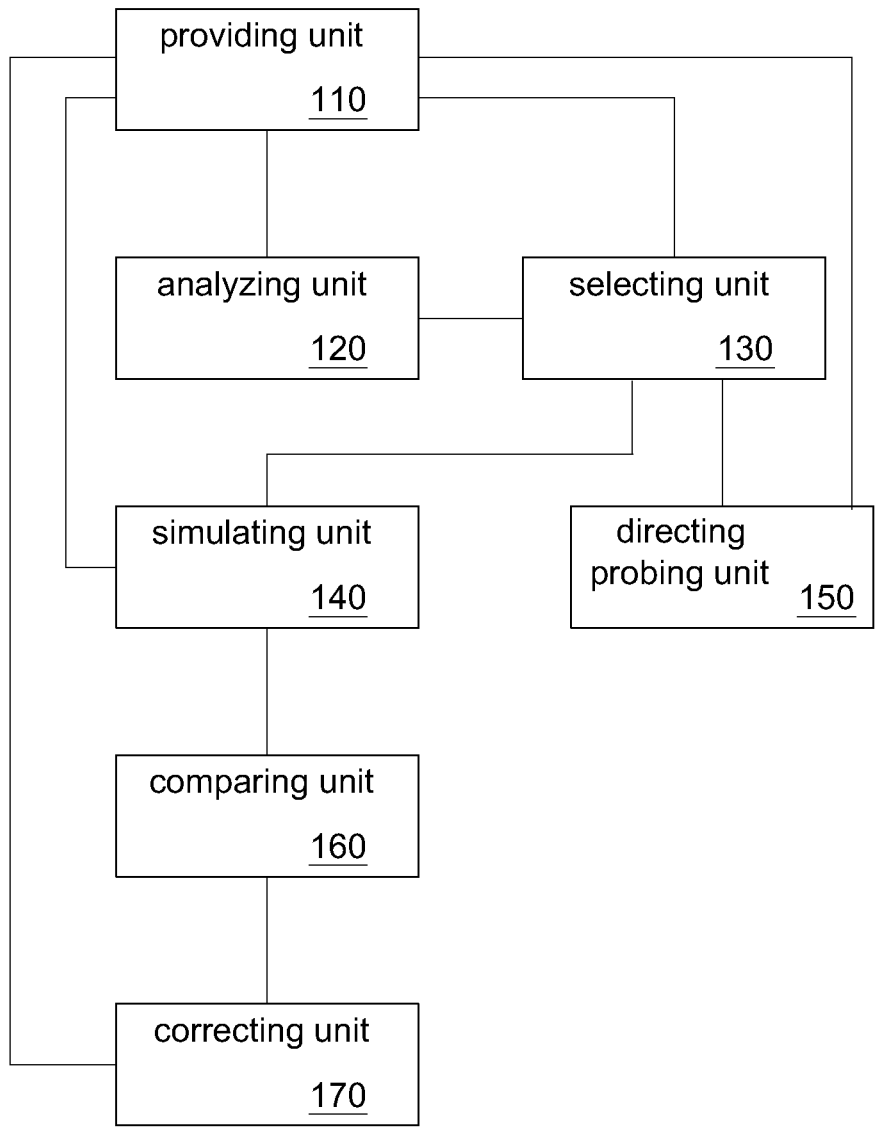
FIG. 1A shows a block diagram of a layout correcting system.

Please referring to FIG. 1A, a block diagram of a layout correcting system 100 is shown. The layout correcting system 1000 can be a combination of a plurality of electronic equipments, a personal computer, a circuit board, a chip or a circuit having a function for correcting layout. The layout correcting system 1000 includes a providing unit 110, an analyzing unit 120, a selecting unit 130, a simulating unit 140, a directing probing unit 150, a comparing unit 160 and a correcting unit 170.

The providing unit 110 is for providing varied data. For example, the providing unit 110 can be a hard disk, a connecting line connecting to a storage medium, a network connecting line, a wireless receiving device, a keyboard or a touch screen.

The analyzing unit 120 is for performing varied analyzing procedures. For example, the analyzing unit 120 can be a chip, a circuit board, a computer, or a circuit having a function for performing an analyzing procedure.

The selecting unit 130 is for performing varied selecting procedures. For example, the selecting unit 130 can be a chip, a circuit board, a computer, an inputting device for inputting the result of selecting or a circuit having a function for performing a selecting procedure.

The simulating unit 140 is for performing varied computer simulating processes. For example, the simulating unit 140 can be a computer, a chip, a circuit board or a circuit having a function for performing a simulating procedure.

The directing probing unit 150 is for performing a direct probing process. The direct probing process is an on-chip test for comparing each device under test and an environment condition thereof by a Boolean algebra algorithm. For example, the directing probing unit 150 can be a combination of testing pins, carriers, voltage appliers and detectors, or a circuit having a function for performing the direct probing process.

The comparing unit 160 is for analyzing a plurality of differences between the results of two processes. For example, the comparing unit 160 can be a computer, a chip, a circuit board or a circuit having a function for performing a comparing procedure.

The correcting unit 170 is for correcting varied data. For example, the comparing unit 170 can be a computer, a chip, a circuit board or a circuit having a function for performing a correcting procedure.

Figure 1B:
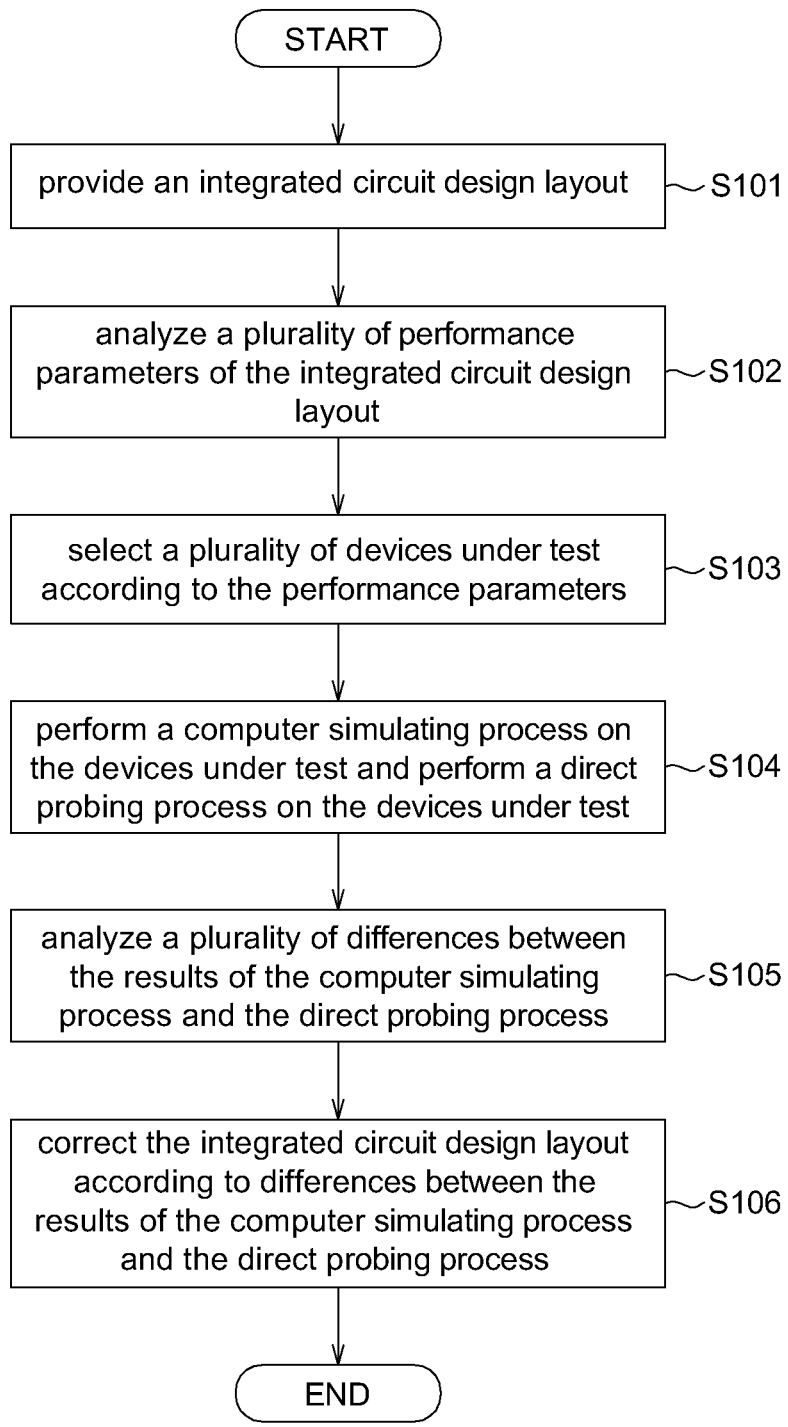
FIG. 1B shows a flowchart of a layout correcting method.

The operation of the layout correcting system 1000 can be illustrated by a flowchart. Please referring to FIG. 1B, FIG. 1B shows a flowchart of a layout correcting method. In step S101, the providing unit 110 provides an integrated circuit design layout.

In step S102, the analyzing unit 120 analyzes a plurality of performance parameters of the integrated circuit design layout. In this step S102 of analyzing the performance parameters of the integrated circuit design layout, the performance parameters may be analyzed according to a critical path, a supply current in a quiescent state (Iddq) or a high resistance (HR) mismatch.

In step S103, the selecting unit 130 selects a plurality of devices under test according to the performance parameters. In this step S103 of selecting devices under test according to the performance parameters, the devices are selected according to a weak pattern, a critical path, a supply current in a quiescent state (Iddq) or a high resistance (HR) mismatch.

In step S104, the simulating unit 140 performs a computer simulating process on the devices under test and the direct probing unit 150 performs a direct probing process on the devices under test. The computer simulating process can be a Simulation Program with Integrated Circuit Emphasis (SPICE). The direct probing process is an on-chip test for comparing each device under test and an environment condition thereof by a Boolean algebra algorithm.

In step S105, the comparing unit 160 analyzes a plurality of differences between the results of the computer simulating process and the direct probing process. The differences between the result of the computer simulating process and the direct probing process are also called "silicon to SPICE (S2S) gap."

In a Taiwanese Patent Application No. 101100515, which is entitled "Integrated circuit design and fabrication method" and was filed by the same assignee of the present application, a plurality of electrical hotspots may be identified from parametric defects in views of parametric marginality. Generally, the performance of the real device which is formed on a silicon substrate and produced in the wafer manufacturing factory is somewhat different from the performance of the circuitry designed by a specified simulation program (e.g. SPICE). The indices about the difference between the real device and the circuitry designed by SPICE are searched. For example, these indices include first-order effects (e.g. the rounding effect, a channel length/width (Leff/Weff) effect, and so on), and second-order or higher-order effects (e.g. a well proximity effect (WPE), a length of diffusion (LOD) effect, a poly space effect (PSE), an oxide diffusion space effect (OSE)). Then, these indices are analyzed to identify the possible electrical hotspots associated with the parametric defects. In a Taiwanese Patent Application No. 100134602, which is entitled "Addressable array robust circuit design" and was filed by the same assignee of the present application, a plurality of test keys are placed on the non-device area of the wafer to measure the electrical properties.

Figure 2A:
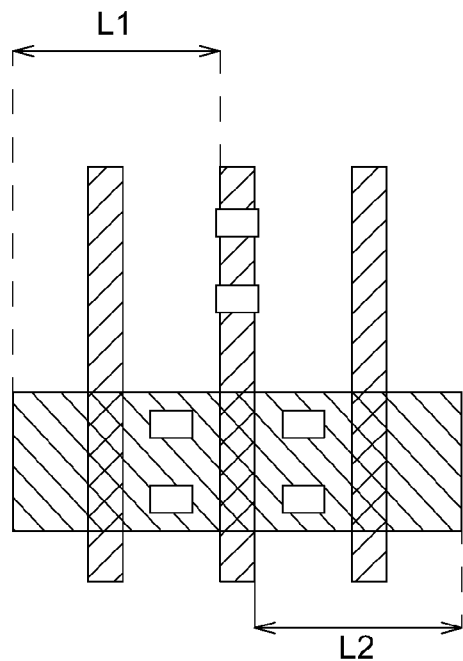
FIG. 2A shows a length of diffusion (LOD) effect.

Please referring to FIG. 2A, a length of diffusion (LOD) effect is shown. A measurement L1 or a measurement L2 may be measured under the length of diffusion (LOD) effect.

Figure 2B:
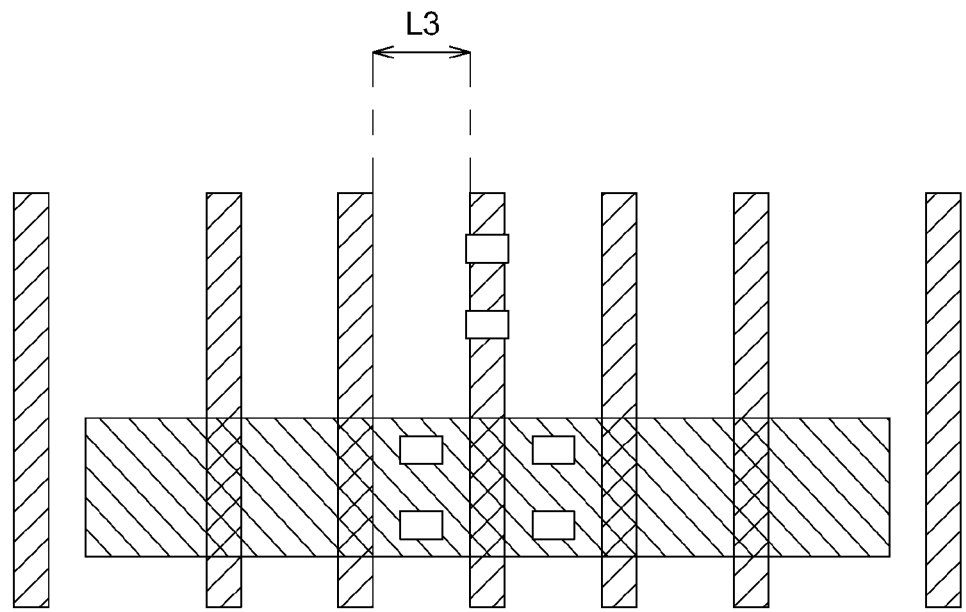
FIG. 2B shows a poly space effect (PSE).

Please referring to FIG. 2B, a poly space effect (PSE) is shown. A measurement L3 may be measured under the poly space effect (PSE).

Figure 2C:
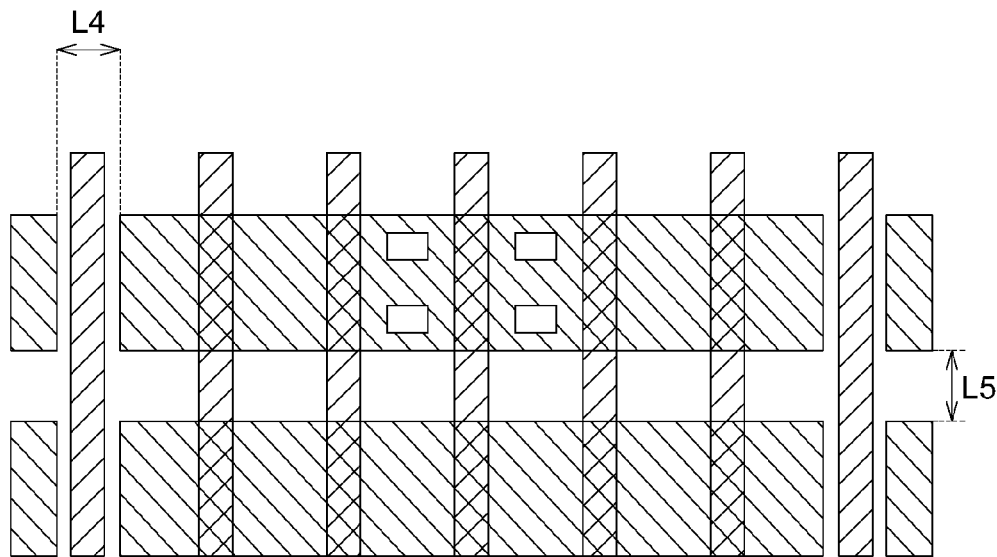
FIG. 2C shows an oxide diffusion space effect (OSE).

Please referring to FIG. 2C, an oxide diffusion space effect (OSE) is shown. A measurement L4 or a measurement L5 may be measured under the oxide diffusion space effect (OSE).

Figure 2D:
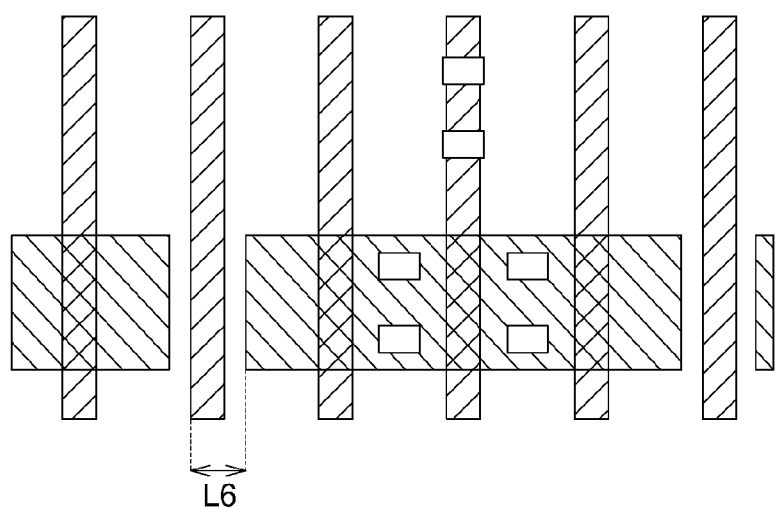
FIG. 2D shows a well proximity effect (WPE).

Please referring to FIG. 2D, a well proximity effect (WPE) is shown. A measurement L6 may be measured under the well proximity effect (WPE).

FIGS. 2A to 2D are just examples for some effect parameters. The invention is not limited to FIGS. 2A to 2D, other effect parameters may be measured.

After the electrical properties of the electronic devices at different regions of the wafer are realized, a process-related standard cell library is established. By comparing the above indices with the standard cell library, the hotspots associated with the parametric marginality are identified.

In step S106, the correcting unit 170 corrects the integrated circuit design layout according to differences between the results of the computer simulating process and the direct probing process. In the present embodiment, the step S106 of correcting the integrated circuit design layout can be called "smart sizing" for sizing different hotspots by different ways.

In one embodiment, some integrated hotspots are generated. The integrated hotspots are prioritized according to a priority rule. If the integrated hotspots cannot meet the DFM (Design for Manufacturability) requirements about device match and uniformity, the device placement of the integrated circuit design layout is re-adjusted or an accurate standard cell is selected. In such way, the electrical properties of the device in the integrated circuit design layout can meet the timing and power-saving requirements, and thus the hotspots are eliminated.

In this step S106 of correcting the integrated circuit design layout, length, width and thickness of hotspots are corrected.

In this step S106 of correcting the integrated circuit design layout, a dummy pattern may be inserted to eliminate the hotspots.

In this step S106 of correcting the integrated circuit design layout, a first size is corrected according to a first set of effect parameters, a second size is corrected according to a second set of effect parameters, and the first set of effect parameters is different from the second set of effect parameters. In the step S106 of correcting the integrated circuit design layout, the first set of effect parameters and the second set of effect parameters may be selected from a group of length of diffusion (LOD), oxide diffusion space effect (OSE), poly space effect (PSE), well proximity effect (WPE), number of contacts (CT) and pattern density (PD).

That is to say, the hotspots on the integrated circuit design layout are not corrected according to the same set of effect parameters.

In one embodiment, different regions of the integrated circuit design layout may be corrected according to different sets of effect parameters.

In one embodiment, the length and the width of one hotspot on the integrated circuit design layout may be corrected according to different sets of effect parameters.

In one embodiment, the length of two different hotspots on the integrated circuit design layout may be corrected according to different sets of effect parameters.

In the step S106 of correcting the integrated circuit design layout, a first size is corrected according to a first algorithm, a second size is corrected according to a second algorithm, and the first algorithm is different from the second algorithm. The first algorithm and the second algorithm may be two different regression equations.

That is to say, the hotspots on the integrated circuit design layout are not corrected according to the same algorithm.

In one embodiment, different regions of the integrated circuit design layout may be corrected according to different algorithms.

In one embodiment, the length and the width of one hotspot on the integrated circuit design layout may be corrected according to different algorithms.

In one embodiment, the length of two different hotspots on the integrated circuit design layout may be corrected according to different algorithms.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A layout correcting method, comprising:
providing an integrated circuit design layout;
analyzing a plurality of performance parameters of the integrated circuit design layout;
selecting a plurality of devices under test according to the performance parameters;
performing a computer simulating process on the devices under test and performing a direct probing process on the devices under test, wherein the direct probing process is an on-chip test for comparing each device under test and an environment condition thereof by a Boolean algebra algorithm;
analyzing a plurality of differences between the results of the computer simulating process and the direct probing process; and
correcting the integrated circuit design layout according to differences between the results of the computer simulating process and the direct probing process.

2. The layout correcting method according to claim 1, wherein in the step of correcting the integrated circuit design layout, a length, a width or a thickness is corrected.

3. The layout correcting method according to claim 1, wherein in the step of correcting the integrated circuit design layout, a dummy pattern is inserted.

4. The layout correcting method according to claim 1, wherein in the step of correcting the integrated circuit design layout, a first size is corrected according to a first set of effect parameters, a second size is corrected according to a second set of effect parameters, and the first set of effect parameters is different from the second set of effect parameters.

5. The layout correcting method according to claim 4, wherein in the step of correcting the integrated circuit design layout, the first set of effect parameters and the second set of effect parameters are selected from a group of length of diffusion (LOD), oxide diffusion space effect (OSE), poly space effect (PSE), well proximity effect (WPE), number of contacts (CT) and pattern density (PD).

6. The layout correcting method according to claim 1, wherein in the step of correcting the integrated circuit design layout, a first size is corrected according to a first algorithm, a second size is corrected according to a second algorithm, and the first algorithm is different from the second algorithm.

7. The layout correcting method according to claim 6, wherein in the step of correcting the integrated circuit design layout, the first algorithm and the second algorithm are two different regression equations.

8. The layout correcting method according to claim 1, wherein in the step of analyzing the performance parameters of the integrated circuit design layout, the performance parameters are analyzed according to a critical path, a supply current in a quiescent state (Iddq) or a high resistance (HR) mismatch.

9. The layout correcting method according to claim 1, wherein in the step of selecting the devices under test according to the performance parameters, the devices under test are selected according to a weak pattern, a critical path, a supply current in a quiescent state (Iddq) or a high resistance (HR) mismatch.

10. A layout correcting system, comprising:
a providing unit for providing an integrated circuit design layout;
an analyzing unit for analyzing a plurality of performance parameters of the integrated circuit design layout;
a selecting unit for selecting a plurality of devices under test according to the performance parameters;
a simulating unit for performing a computer simulating process on the devices under test;
a directing probing unit for performing a direct probing process on the devices under test, wherein the direct probing process is an on-chip test for comparing each device under test and an environment condition thereof by a Boolean algebra algorithm;
a comparing unit for analyzing a plurality of differences between the results of the computer simulating process and the direct probing process; and
a correcting unit for correcting the integrated circuit design layout according to differences between the results of the computer simulating process and the direct probing process.

11. The layout correcting system according to claim 10, wherein the correcting corrects a length, a width or a thickness.

12. The layout correcting system according to claim 10, wherein the correcting unit inserts a dummy pattern.

13. The layout correcting system according to claim 10, wherein the correcting unit corrects a first size and a second according to a first set of effect parameters and a second set of effect parameters respectively, and the first set of effect parameters is different from the second set of effect parameters.

14. The layout correcting system according to claim 13, wherein the first set of effect parameters and the second set of effect parameters are selected from a group of length of diffusion (LOD), oxide diffusion space effect (OSE), poly space effect (PSE), well proximity effect (WPE), number of contacts (CT) and pattern density (PD).

15. The layout correcting system according to claim 10, wherein the correcting unit corrects a first size and a second size according to a first algorithm and a second algorithm respectively, and the first algorithm is different from the second algorithm.

16. The layout correcting system according to claim 15, wherein the first algorithm and the second algorithm are two different regression equations.

17. The layout correcting system according to claim 10, wherein the analyzing unit analyzes the performance parameters according to a critical path, a supply current in a quiescent state (Iddq) or a high resistance (HR) mismatch.

18. The layout correcting system according to claim 10, wherein the selecting unit selects the devices under test according to a weak pattern, a critical path, a supply current in a quiescent state (Iddq) or a high resistance (HR) mismatch.

* * * * *